(12) United States Patent
Yoneda

(10) Patent No.: US 7,019,458 B2
(45) Date of Patent: Mar. 28, 2006

(54) ELECTROLUMINESCENT DISPLAY DEVICE

(75) Inventor: Kiyoshi Yoneda, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 170 days.

(21) Appl. No.: 10/444,067

(22) Filed: May 23, 2003

(65) Prior Publication Data

US 2004/0004436 A1    Jan. 8, 2004

(30) Foreign Application Priority Data

May 24, 2002 (JP) .............................. 2002-150096

(51) Int. Cl.
*H01J 1/62* (2006.01)
(52) U.S. Cl. ...................... 313/512; 313/292
(58) Field of Classification Search ................ 313/512, 313/506, 504, 292; 428/690
See application file for complete search history.

(56) References Cited

U.S. PATENT DOCUMENTS

| | | | | |
|---|---|---|---|---|
| 5,140,450 A | * | 8/1992 | Nikaido | 349/158 |
| 5,483,120 A | * | 1/1996 | Murakami | 313/506 |
| 5,674,758 A | * | 10/1997 | McCarthy | 438/26 |
| 5,721,160 A | * | 2/1998 | Forrest et al. | 438/28 |
| 5,920,080 A | * | 7/1999 | Jones | 257/40 |
| 6,111,355 A | * | 8/2000 | Inoue et al. | 313/506 |
| 6,284,342 B1 | * | 9/2001 | Ebisawa et al. | 428/69 |
| 6,664,563 B1 | * | 12/2003 | Yamada et al. | 257/40 |
| 6,737,176 B1 | * | 5/2004 | Otsuki et al. | 428/690 |
| 6,744,197 B1 | * | 6/2004 | Park et al. | 313/504 |
| 6,777,870 B1 | * | 8/2004 | Sundahl | 313/504 |
| 6,833,668 B1 | * | 12/2004 | Yamada et al. | 313/505 |
| 6,846,579 B1 | * | 1/2005 | Anderson et al. | 428/690 |
| 6,873,100 B1 | * | 3/2005 | Park et al. | 313/506 |
| 6,888,308 B1 | * | 5/2005 | Guenther | 313/512 |
| 6,890,782 B1 | * | 5/2005 | Yamada | 438/29 |

* cited by examiner

*Primary Examiner*—Joseph Williams
*Assistant Examiner*—Dalei Dong
(74) *Attorney, Agent, or Firm*—Morrison & Foerster LLP

(57) ABSTRACT

In an organic EL panel having a device glass substrate provided with an organic EL element on a surface thereof, a sealing glass substrate attached to the device glass substrate and a desiccant layer formed on a surface of the sealing glass substrate, spacers are disposed between a cathode of the organic EL element and the desiccant layer. A heat-conductive layer can be formed on a surface of the sealing glass substrate including a pocket portion. The heat-conductive layer can be formed by vapor depositing or sputtering a metal layer such as a Cr layer or an Al layer. This inhibits damaging the organic EL element and increases a heat dissipating ability, thereby inhibiting deterioration of a device property caused by temperature rise.

14 Claims, 3 Drawing Sheets

# ELECTROLUMINESCENT DISPLAY DEVICE

BACKGROUND OF THE INVENTION

1. Field of the Invention

The present invention relates to a structure of the electroluminescent display device.

2. Description of the Related Art

In recent years, an electroluminescent (hereafter, referred to as EL) display devices with an organic EL element have been receiving an attention as a display device substituting for a CRT and an LCD.

Since the organic EL element is sensitive to moisture, an organic EL display panel having the EL element thereon is covered with a metal cap or a glass cap coated with a desiccant, thereby inhibiting moisture infiltration. FIG. 5 is a cross-sectional view of a structure of a conventional organic EL display panel. A device glass substrate 100 has a display region having many organic EL elements (not shown) on a surface thereof. The whole surface of the display region is covered with a cathode 101 of the organic EL element. The cathode 101 is made of, for example, an Al (aluminum) layer. The device glass substrate 100 is mounted with a polarizer 102 on a back surface thereof.

The device glass substrate 100 of the above structure is attached to a sealing glass substrate 104 with sealing resin 103 made of an epoxy resin or the like. The sealing glass substrate 104 has a concave portion (hereafter, referred to as a pocket portion 105) formed by etching in a region corresponding to the display region. A desiccant layer 106 for absorbing moisture is coated in the pocket portion 105.

In the conventional sealing structure of the organic EL panel described above, however, flexure occurs in the device glass substrate 100 or the sealing glass substrate 104 by an external force so that the organic EL element comes into contact with the desiccant layer 10. Thus, the cathode 101 or an organic emissive layer below the cathode 101 is damaged.

Furthermore, the organic EL element is a self-emission device and generates heat when emitting light. This raises the temperature of the glass substrate having the organic EL element. The above conventional sealing structure is poor in heat dissipation so that the temperature rises rapidly. If the temperature rises, for example, to 60 degrees or higher, the life of the organic emissive material of the organic EL element is shortened.

SUMMARY OF THE INVENTION

The invention provides an electroluminescent display device that includes a first insulating substrate having a plurality of electroluminescent elements on a surface thereof, a second insulating substrate attached to the first insulating substrate so that an inner surface of the second insulating substrate faces the electroluminescent elements on the first insulating substrate, a desiccant layer disposed on the inner surface of the second insulting substrate, and a plurality of spacers disposed between the electroluminescent elements and the desiccant layer.

DETAILED DESCRIPTION OF THE INVENTION

Figure 1:
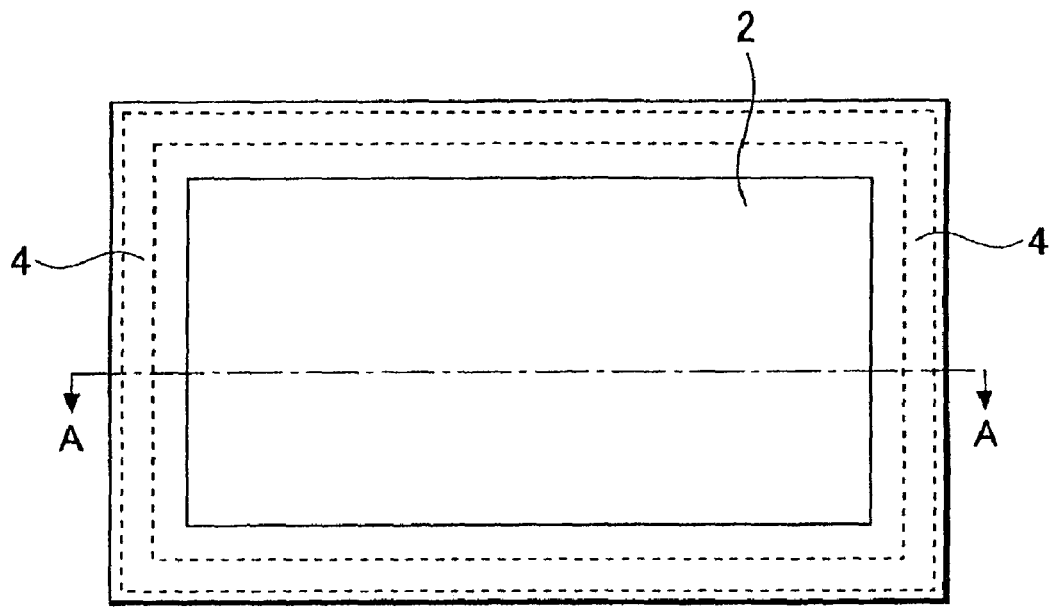
FIG. 1 is a plan view of an EL display device according to an embodiment of the invention.

An embodiment of the invention will be described with reference to the drawings in detail. FIG. 1 is a plan view of an EL display device according to this embodiment.

Figure 2:
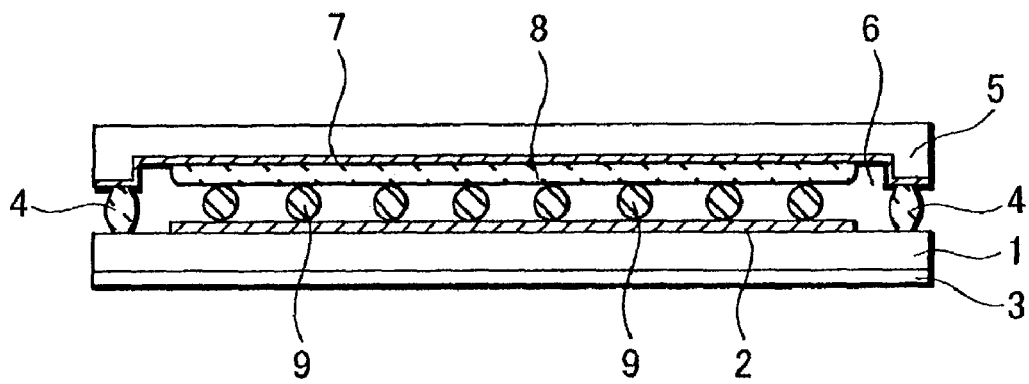
FIG. 2 is a cross-sectional view of the device of FIG. 1 along line A—A of FIG. 1.

FIG. 2 is a cross-sectional view of the device along A—A line of FIG. 1.

A device glass substrate 1 has a display region having many organic EL elements (not shown) on a surface thereof. The device glass substrate 1 is approximately 0.7 mm in thickness. In this display region, a plurality of pixels is disposed in a matrix and the organic EL element is disposed in each of the pixels.

The whole surface of the display region is covered by a cathode 2 of the organic EL element. The cathode 2 is made of, for example, A1. The device glass substrate 1 has a polarizer 3 mounted on a back surface thereof.

The device glass substrate 1 of the above structure is attached to a sealing glass substrate 5 with sealing resin 4 made of an epoxy resin or the like. The sealing glass substrate 5 is approximately 0.7 mm in thickness. The sealing glass substrate 5 has a concave portion (hereafter, referred to as a pocket portion 6) formed by etching in a region corresponding to the display region. The pocket portion 6 is approximately 0.3 mm in depth.

A heat-conductive layer 7 is formed in the pocket portion 6. The heat-conductive layer 7 is formed by vapor depositing or sputtering a metal such as Cr (chromium) or A1. If the heat-conductive layer 7 is made of Cr, the thickness thereof is preferably about 100 μm.

A desiccant layer 8 for absorbing moisture is coated in the pocket portion 6 on the heat-conductive layer 7. The desiccant layer 8 is formed, for example, by coating a solvent dissolved with powdered calcium oxide or barium oxide and resin as an adhesive on a bottom of the pocket portion 6 and then hardening the solvent by UV irradiation or heating.

Heat-conductive spacers 9 are inserted between the cathode 2 of the organic EL element and the desiccant layer 8. The material of the heat-conductive spacers 9 is preferably soft metal, for example, indium.

The heat-conductive spacers 9 may be fixed or movably inserted between the cathode 2 of the organic EL element and the desiccant layer 8. That is, the heat-conductive spacers 9 may be provided in any way as long as the spacers function as a cushion for securing a gap between the cathode 2 of the organic EL element and the desiccant layer 8. This cushion protects the organic EL element from an external force when the external force is applied to the device glass substrate 1 or the sealing glass substrate 5. For this purpose, the heat-conductive spacers 9 are preferably round in shape.

In the above structure, the heat-conductive spacers 9 are provided between the cathode 2 of the organic EL element and the desiccant layer, thereby inhibiting the contact between the organic EL element and the desiccant layer 8, which may result in damaging the organic EL element (including the cathode 2). The heat-conductive spacers 9 have the effect of dissipating heat generated by the organic EL element. The heat is conducted through the heat-conductive spacers 9 and the desiccant layer 8, and reaches the sealing glass substrate 5. This prevents the deterioration of the organic EL element.

Since the heat-conductive layer 7 is provided on the sealing glass substrate 5, the heat generated by the organic EL element is dissipated rapidly through the heat-conductive layer 7 to reach the side of the sealing glass substrate 5. The feat conduction path is through the cathode 2, the heat-conductive spacers 9 and the heat-conductive layer 7. This inhibits temperature rise in the organic EL element and deterioration of a device property.

In this embodiment, a structure having the pocket portion 6 is described. Providing the pocket portion 6 makes a gap between the organic EL element and the desiccant layer 8 larger, making the contact of the two substrates that much more less likely. However, the heat-conductive spacers 9 may be placed between the two substrate without forming the pocket portion 6 in the sealing glass substrate 5.

Furthermore, although the structure provided with the heat-conductive spacers 9 and the heat-conductive layer 7 increases a heat-dissipating ability, a structure provided with the heat-conductive spacers 9 only without the heat-conductive layer 7 increases the heat-conducting ability as well.

In the above description, the device glass substrate 1 and the sealing glass substrate 5 are attached with the sealing resin 4. However, the device glass substrate 1 and the sealing glass substrate 5 may be attached together by melting one or both of the surface of the device glass substrate 1 and the surface of the sealing glass substrate 5 by irradiating laser beams thereto.

Figure 3:
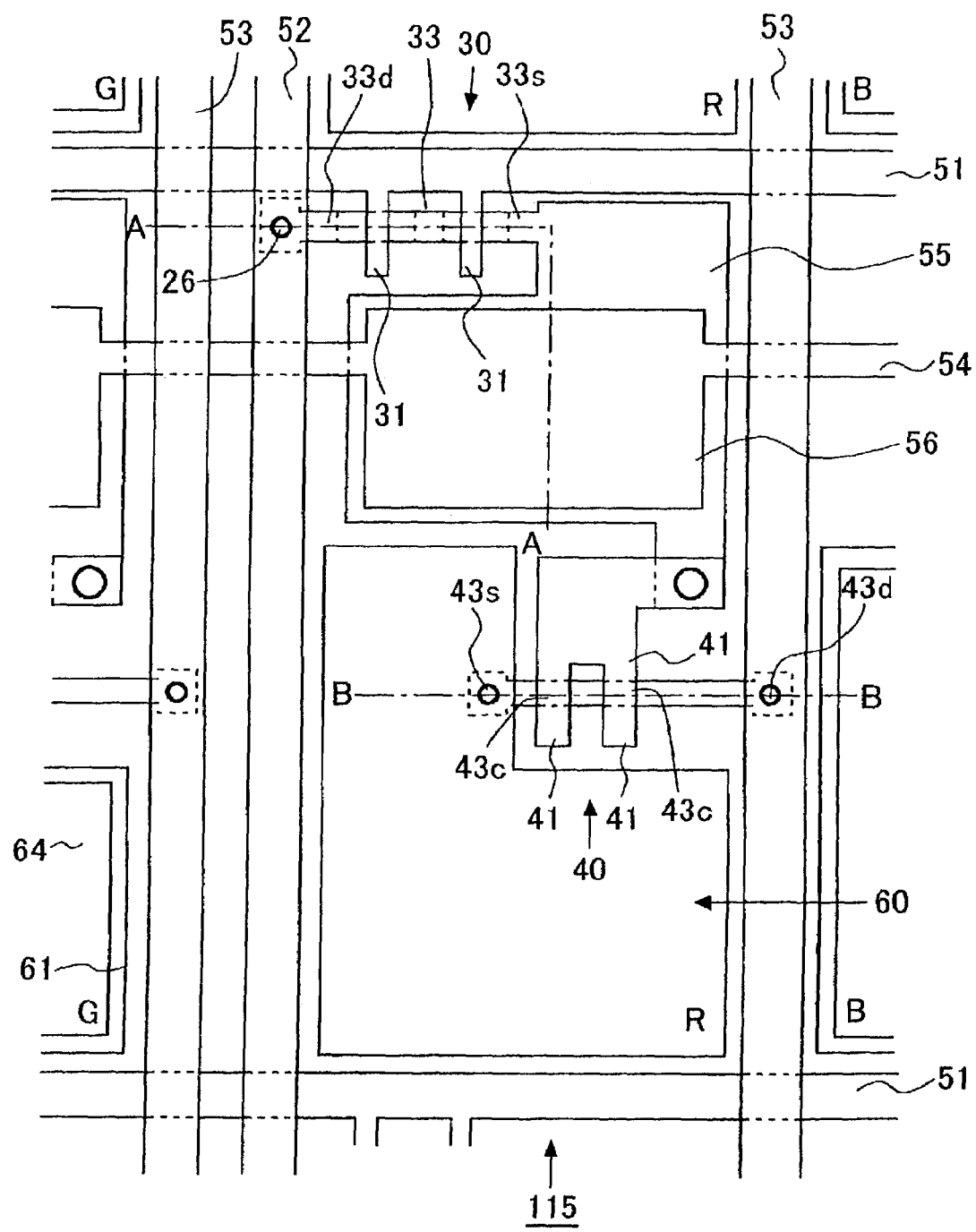
FIG. 3 is a plan view of a pixel of the organic EL display device of the embodiment.
Figure 4A:
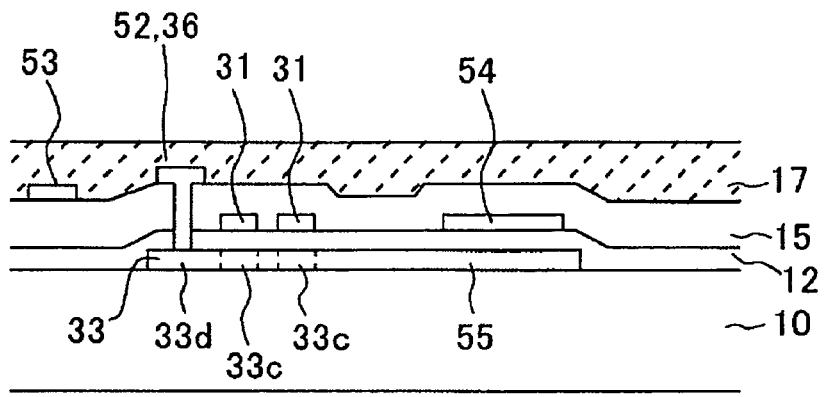
FIGS. 4A and 4B are cross-sectional views of the pixel of FIG. 3.
Figure 4B:
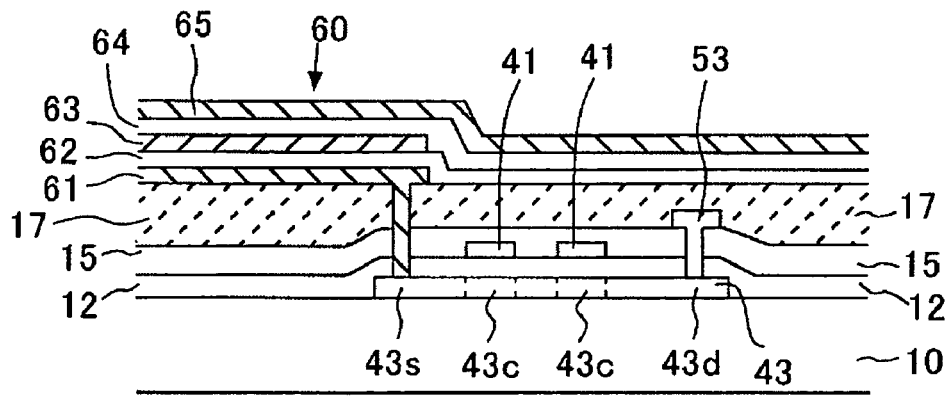
Figure 5:
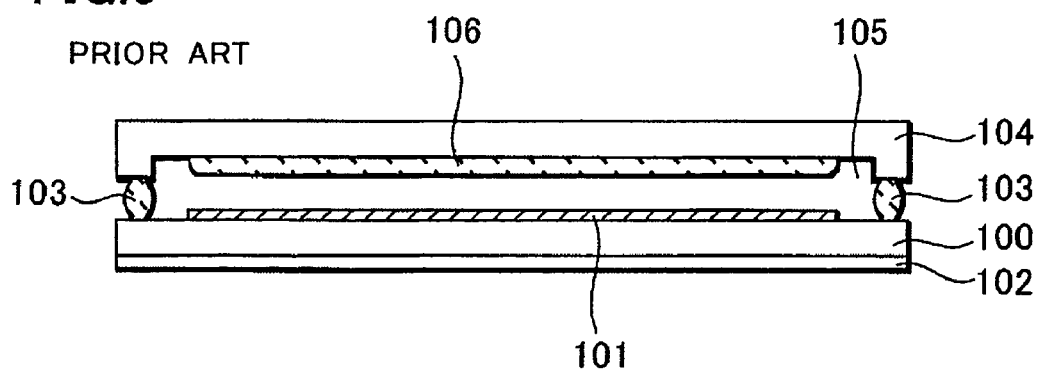
FIG. 5 is a cross-sectional view of a conventional EL display device.

Next, an example of a structure of the pixel of the organic EL display device of this embodiment will be described. FIG. 3 is a plan view of the pixel of the organic EL display device. FIG. 4A is a cross-sectional view along A—A line of FIG. 3 and FIG. 4B is a cross-sectional view along B—B line of FIG. 3.

As shown in FIG. 3, the pixel 115 is formed in a region enclosed with a gate signal line 51 and a drain signal line 52. A plurality of the pixels 115 is disposed in a matrix.

An organic EL element 60 as a self-emission element, a switching TFT (thin film transistor) 30 for controlling a timing of supplying an electric current to the organic EL element 60, a driving TFT 40 for supplying an electric current to the organic EL element 60 and a storage capacitor are disposed in the pixel 115. The organic EL element 60 includes an anode 61, an emissive layer made of organic materials such as an emission material, a hole transport material and so on, and a cathode 65.

A switching TFT 30 is provided in a periphery of a point of intersection of both signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic EL element 60, while a drain 43d is connected to a driving source line 53 as a current source to be supplied to the organic EL element 60.

The storage capacitor electrode line 54 is disposed in parallel with the gate signal line 51. The storage capacitor electrode line 54 is made of Cr or the like, and forms a capacitor by storing an electric charge together with the capacitor electrode 55 connected to the source 33s of the TFT 30 through a gate insulating film 12. A storage capacitor 56 is provided for storing voltage applied to the gate electrode 41 of the driving TFT 40.

As shown in FIGS. 4A and 4B, the organic EL display device is formed by laminating the TFTs and the organic EL element sequentially on a substrate 10 such as a substrate made of glass or synthetic resin, a conductive substrate or a semiconductor substrate. When using a conductive substrate or a semiconductor substrate as the substrate 10, however, an insulating film such as $SiO_2$ or $SiN_x$ is formed on the substrate 10, and then the switching TFT 30, the driving TFT 40 and the organic EL element 60 are formed thereon. Each of the TFTs has a so-called top gate structure in which a gate electrode is disposed above an active layer with a gate insulating film being interposed therebetween. The TFTs may be a so-called bottom gate structure in which an active layer is laminated on the gate electrode.

The switching TFT 30 will be described first. As shown in FIG. 4A, an amorphous silicon film (hereafter, referred to as an a-Si film) is formed on the insulating substrate 10 by a CVD method or the like. The a-Si film is irradiated by laser beams for melting and recrystalizing to form a poly-silicon film (hereafter, referred to as a p-Si film) as an active layer 33. A channel 33c, and a source 33s and a drain 33d on both sides of the channel 33c are provided in the active layer 33. On the active layer 33, a single-layer or a multi-layer of a $SiO_2$ film and a $SiN_x$ film is formed as the gate insulating film 12. The gate signal line 51 made of metal having a high melting point such as Cr or Mo (molybdenum) and also serving as a gate electrode 31, the drain signal line 52 made of Al, and the driving source line 53 made of Al and serving as a driving source of the organic EL element are disposed on the gate insulating film 12.

An interlayer insulating film 15 laminated with an $SiO_2$ film, an $SiN_x$ film and an $SiO_2$ film sequentially is formed on the whole surfaces of the gate insulating film 12 and the active layer 33. A drain electrode 36 is provided by filling a metal such as Al in a contact hole provided correspondingly to a drain 33d. Furthermore, a planarization insulating film 17 for planarizing a surface, which is made of organic resin, is formed on a whole surface.

Next, the driving TFT 40 of the organic EL element will be described. As shown in FIG. 4B, an active layer 43 formed by poly-crystalizing an a-Si film by laser beam irradiation, the gate insulating film 12, and the gate electrode 41 made of a metal having a high melting point such as Cr or Mo are formed sequentially on the insulating substrate 10. A channel 43c, and a source 43s and a drain 43d on both sides of the channel 43c are provided in the active layer 43. The interlayer insulating film 15 laminated with an $SiO_2$ film, an $SiN_x$ film and an $SiO_2$ film sequentially is formed on the whole surfaces of the gate insulating film 12 and the active layer 43. The driving source line 53 connected to a driving source by filling a metal such as Al in a contact hole provided correspondingly to a drain 43d is disposed.

Furthermore, a planarization insulating film 17 for planarizing the surface, which is made of, for example, an organic resin is formed on the whole surface. A contact hole is formed in a position corresponding to a source 43s in the planarization insulating film 17. A transparent electrode made of ITO (indium tin oxide) and contacting the source 43s through the contact hole, i.e., the anode 61 of the organic EL element, is formed on the planarization insulating film 17. The anode 61 is formed in each of the pixels, being isolated as an island.

The organic EL element 60 includes the anode 61 made of a transparent electrode such as ITO, a hole transport layer 62 having a first hole transport layer made of MTDATA (4,4-bis (3-methylphenylphenylamino)biphenyl) and a second hole transport layer made of TPD (4,4,4-tris (3-methylphenylphenylamino) triphenylanine), an emissive layer 63 made of $Bebq_2$ (bis(10-hydroxybenzo[h]quinolinato)beryllium)

containing a quinacridone derivative, an electron transport layer 64 made of Bebq$_2$, and a cathode 65 made of magnesium-indium alloy, Al or Al alloy.

In the organic EL element 60, a hole injected from the anode 61 and an electron injected from the cathode 65 are recombined in the emissive layer and an exciton is formed by exciting an organic molecule of the emissive layer 63. Light is emitted from the emissive layer 63 in a process of radiation of the exciton and then released outside through the transparent anode 61 and the transparent insulating substrate 10. Thus, the device works as a display device.

What is claimed is:

1. An electroluminescent display device comprising:
   a first insulating substrate having a plurality of electroluminescent elements on a surface thereof;
   a second insulating substrate attached to the first insulating substrate so that an inner surface of the second insulating substrate faces the electroluminescent elements on the first insulating substrate and the first and second insulating substrates define a cavity therebetween;
   a desiccant layer disposed on the inner surface of the second insulting substrate so as to absorb moisture present in the cavity defined by the first and second insulating substrates; and
   a plurality of spacers disposed between the electroluminescent elements and the desiccant layer.

2. The electroluminescent display device of claim 1, wherein the spacers comprise heat-conductive spacers.

3. The electroluminescent display device of claim 2, wherein the heat-conductive spacers are configured to be movable between the electroluminescent elements and the desiccant layer.

4. The electroluminescent display device of claim 2, wherein the heat-conductive spacers are round in shape.

5. The electroluminescent display device of claim 2, further comprising a heat-conductive layer disposed on the inner surface of the second insulating substrate, wherein the desiccant layer is disposed on the heat-conductive layer.

6. The electroluminescent display device of claim 5, further comprising a concave portion formed on the inner surface of the second insulating substrate, wherein the heat-conductive layer is disposed in the concave portion.

7. The electroluminescent display device of claim 5, wherein the heat-conductive layer comprises a Cr layer or an Al layer.

8. The electroluminescent display device of claim 2, wherein the heat-conductive spacers are made of a metal.

9. The electroluminescent display device of claim 8, wherein the heat-conductive spacers comprise spacers made of indium.

10. The electroluminescent display device of claim 1, further comprising a sealing resin layer attaching the second insulating substrate to the first insulating substrate.

11. The electroluminescent display device of claim 1, wherein the first insulating substrate and the second insulating substrate are fused together at corresponding contact portions.

12. An electroluminescent display device comprising:
    a first insulating substrate having a plurality of electroluminescent elements on a surface thereof
    a second insulating substrate attached to the first insulating substrate so that an inner surface of the second insulating substrate faces the electroluminescent elements on the first insulating substrate;
    an insulating desiccant layer disposed on the inner surface of the second insulting substrate; and
    a plurality of spacers made of a metal and disposed between the electroluminescent elements and the insulating desiccant layer,
    wherein electroluminescent light is released through the first insulating substrate and the spacers are in contact with the insulating desiccant layer.

13. The electroluminescent display device of claim 12, wherein the metal comprises indium.

14. An electroluminescent display device comprising:
    a first insulating substrate having a plurality of electroluminescent elements on a surface thereof;
    a second insulating substrate attached to the first insulating substrate so that an inner surface of the second insulating substrate faces the electroluminescent elements on the first insulating substrate and the first and second insulating substrates define a cavity therebetween;
    a heat-conductive layer disposed on the inner surface of the second insulating substrate;
    a desiccant layer that is disposed on and in contact with the heat-conductive layer so as to absorb moisture present in the cavity defined by the first and second insulating substrates; and
    a plurality of spacers disposed between the electroluminescent elements and the desiccant layer.

* * * * *